United States Patent [19]
Hiraoka et al.

[11] Patent Number: 5,368,681
[45] Date of Patent: Nov. 29, 1994

[54] METHOD FOR THE DEPOSITION OF DIAMOND ON A SUBSTRATE

[75] Inventors: Hiroyuki Hiraoka, Kowloon; Stefan A. Lätsch, Hong Kong; Rong-Fu Xiao, Laguna City, all of Hong Kong

[73] Assignees: Hong Kong University of Science; Hong Kong University of Science and Technology; R and D Corporation Limited, Hong Kong, Hong Kong

[21] Appl. No.: 73,506

[22] Filed: Jun. 9, 1993

[51] Int. Cl.$^5$ .............................................. C30B 29/04
[52] U.S. Cl. ..................................... 427/585; 423/446; 204/157.47; 427/596
[58] Field of Search ....... 423/446; 156/610, DIG. 68; 427/596; 204/157.41, 157.47

[56] References Cited

U.S. PATENT DOCUMENTS

| | | | |
|---|---|---|---|
| 4,961,958 | 10/1990 | Desphandey et al. | 423/446 |
| 5,055,318 | 10/1991 | Deutchman et al. | 423/446 |
| 5,236,545 | 8/1993 | Pryer | 156/614 |
| 5,242,711 | 9/1993 | DeNatale et al. | 156/652 |

FOREIGN PATENT DOCUMENTS 01103991  4/1989  Japan .............................. 204/157.41

*Primary Examiner*—Robert Kunemund
*Attorney, Agent, or Firm*—Burns, Doane, Swecker & Mathis

[57] ABSTRACT

A method is disclosed for the deposition of crystalline diamond on a substrate such as a silicon wafer. A polymer (for example poly(methylmethacrylate)) is provided as a target for laser ablation using for example an ArF excimer laser or an Nd-Yag laser. The laser ablation is performed in the presence of a reactive gas such as oxygen or hydrogen. The substrate is heated to a temperature of between 450 and 700 degrees celsius.

10 Claims, 6 Drawing Sheets

METHOD FOR THE DEPOSITION OF DIAMOND ON A SUBSTRATE

BACKGROUND OF THE INVENTION

This invention relates to a method for the deposition of diamond onto a substrate, for example the deposition of a diamond film onto a silicon wafer substrate.

PRIOR ART

Diamond is an important material not only for ornamental purposes, but for many industrial applications. Diamond has many unique properties such as high thermal conductivity with an electrically insulating nature, high hardness and refractive index as a consequence of which it has many varied uses. Diamond also has very low etch rates in oxygen and other harsh chemical conditions. There is therefore a large demand for artificial diamond as an essential material for processes such as polishing, grinding, cutting and so on, and also as a substrate for future devices.

Diamond is currently synthesized artificially in two main ways: (1) catalytic high temperature, high pressure conversion of graphite, and (2) chemical vapour deposition using hot filaments, acetylene torch or plasma processes. This latter method is used to deposit diamond films on silicon or other substrates, and has been the subject of many articles and conferences. See for example, T. Tzeng et al, editors, "Applications Of Diamond Films and Related Materials" Elsevier, 1991—*Proc. First Intl. Conf. on Applications of Diamond Films and Related Materials*, Auburn., Ala., USA, Aug. 17–22 1991 and R. E. Clausing et al editors, "Diamond and Diamond—like Films and Coatings" Plenum Press, 1991—*Proc. NATO Adv. Study Inst. Diamond and Diamond-like Films and Coatings*, Jul. 22–Aug. 1, 1990. Also known in the prior art is the laser ablation of graphite or polymers to produce diamond-like carbon (DLC) films in an amorphous form: I. S. Athwal et al "Techniques for depositing DLC films by pulsed laser ablation of organic solids" *Diamond and Related Materials*, 1 (1992) 731-734; C. G. Collins et al., "Amorphic diamond films produced by laser ablation" MRS Boston Meeting, Nov. 30–Dec. 4, 1992; S. Leppavuori et al, "Laser ablation deposition of diamond like Carbon films" MRS Boston Meeting, Nov. 30–Dec. 4, 1992; L. Ganapathi et al. "YBCO encapsulation by diamond like carbon films deposited by laser ablation technique" MRS Boston Meeting. Nov. 30–Dec,. 4, 1992, These authors believe that the diamond-like films were formed from ionic species with an application of a high bias potential with relatively low substrate temperatures.

SUMMARY OF THE INVENTION

An object of the invention is to provide an alternative method for the deposition of diamond films on a substrate. According to the invention this is achieved by a method comprising the laser ablation of a polymer in the presence of a reactive gas and a heated substrate, and the deposition of diamond crystals on the substrate Preferably the polymer is one consisting of carbon, oxygen and hydrogen, and in particular a polymer consisting of carbon and hydrogen in a ratio of from 1:0 to 1:2. Poly(methylmethacrylate) (PMMA) has proved to be a particularly suitable polymer but others, such as polystyrene, could also be used. It may also be possible to use graphite instead of a polymer.

Any suitable laser may be employed in the method of the invention, though particularly preferred examples include a Nd-Yag laser or an excimer laser The preferred reactive gas is oxygen, but as an alternative hydrogen may also be used. Preferably the reactive gas is supplied at a pressure of up to 5 Torr. The preferred substrate is a silicon wafer heated to a temperature of from 400 to 700 degrees celsius.

DETAILED DESCRIPTION OF THE INVENTION

The present invention uses laser ablation of polymers such as for example poly(methylmethacrylate) (PMMA) in the presence of a reactive gas such as oxygen, at a low pressure of only a few Torr, to deposit crystalline diamond films on a substrate such as heated Si<100>, Si<110> or Si<111> wafers. The wafers may be heated to a temperature of between 400 and 700 degrees celsius, and the substrate is biased to $-50V$. An ArF excimer laser is used at a fluerice level of about $0.3J/cm^2$ at a pulse rate of 5 Hz.

These conditions are very different form those reported in the prior art. In prior proposals using laser ablation to produce DLC films there has been no reactive gas present. The target materials were always graphite, with the exception of Athwal et al who reported the formation of DLC films without much characterisation. Prior researchers have used high bias potentials, believing that only ionic species result in diamond formation. Their substrate temperatures were relatively low, approximately 100 degrees celsius, and at higher temperatures the yield of diamond type structures diminished. Furthermore these structures were always amorphous in form rather than the crystalline structure obtained by the method of the present invention.

An example of typical conditions for the deposition of a diamond film on a substrate in accordance with the present invention is as follows:

Target polymer: Poly(methylmethacrylate)
Laser source: ArF excimer laser operating at 193 nm
Laser fluence: 280 $mJ/cm^2$
Laser energy: 140 mJ
Laser rep. rate: 4 Hz
Substrate: Si<100>, Si<110> or Si<111>
Substrate temperature: 600 degrees celsius
Reactive gas: Oxygen at 1–2 Torr
Duration of laser exposure: 75 minutes With these conditions diamond crystal growth is observed on the substrate after 12 minutes of laser exposure. The substrate is placed 3 to 4 cm from the polymer target, but not parallel to the target.

Figure 1:
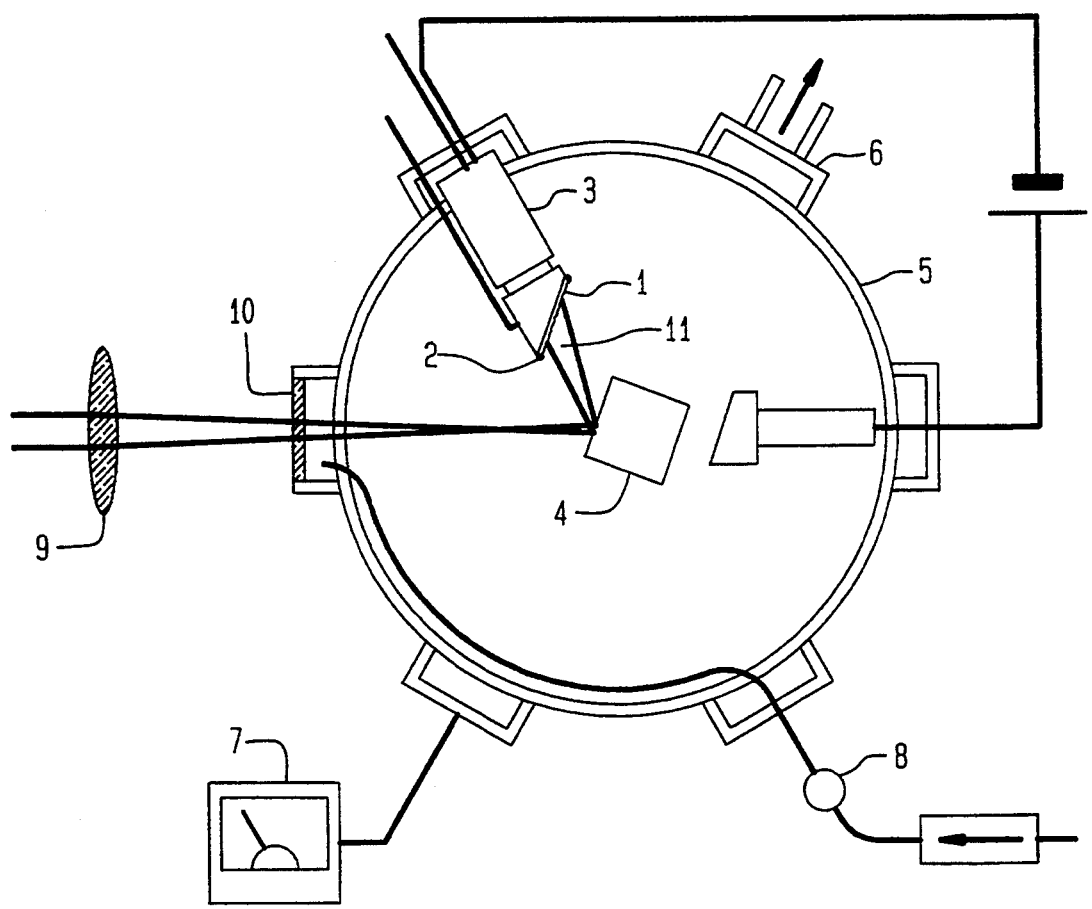
FIG. 1 is a schematic diagram of apparatus for performing the method of the present invention.

FIG. 1 illustrates schematically a possible apparatus for performing the method of the invention. The wafer 1 is mounted in a tungsten clamp 2 on a thermal copper element 3. Copper element 3 is connected to a DC supply so as to heat the wafer. A polymer or graphite block 4 and the wafer 1 are provided in a vacuum chamber 5. Vacuum chamber 5 includes a pump 6, pressure gauge 7, and valve means 8 connected to a supply of reactive gas. A laser beam is fired at the polymer or graphite block 4 through a focussing lens 9 and a viewport 10 to produce a plume 11 of ablation products.

Figure 2:
FIG. 2 is a scanning electron microscope (SEM) micrograph of octahedral diamond crystals deposited by polymer laser ablation in accordance with an embodiment of the present invention.
Figure 3:
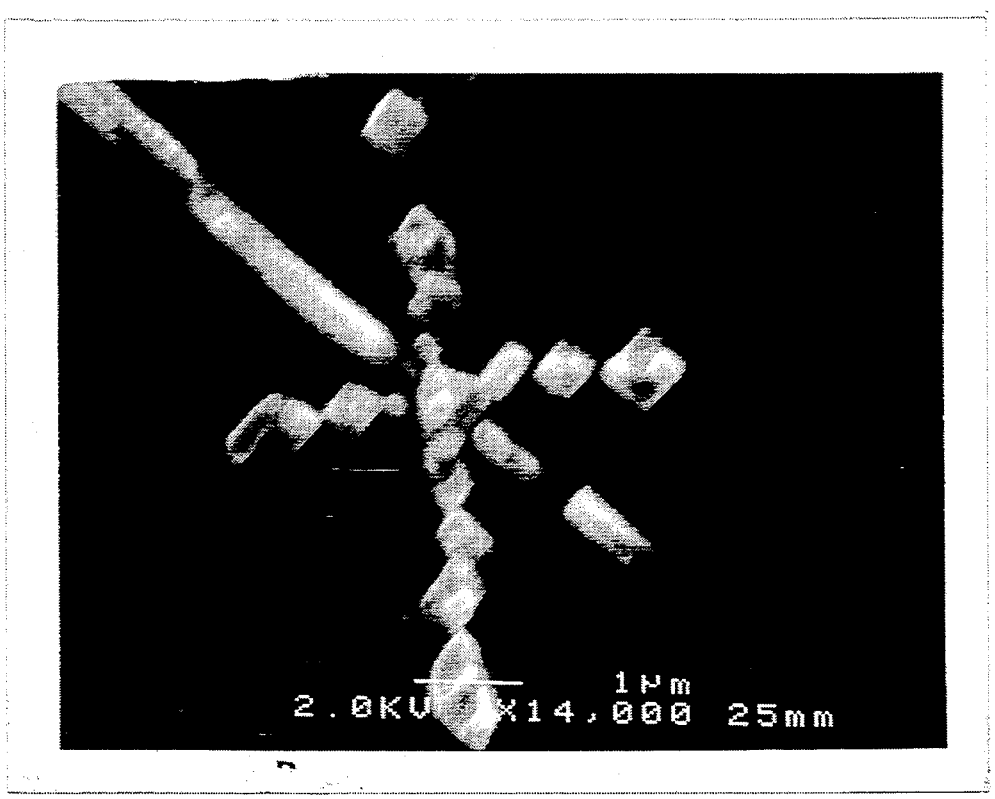
FIG. 3 is a SEM micrograph of cubic diamond crystals deposited by polymer laser ablation in accordance with an embodiment of the present invention.
Figure 6:
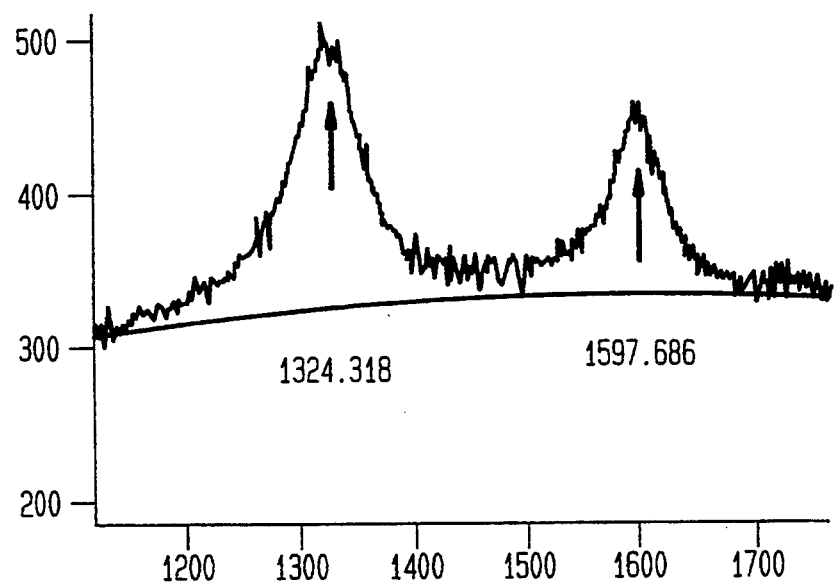
FIG. 6 is a Renishaw Raman spectrum of the crystals of FIG. 3.

FIG. 2 is a scanning electron microscope (SEM) picture of octahedral diamond crystals formed on a substrate in accordance with the method of the present invention. The crystals are approximately 2 microns in diameter. FIG. 3 is a SEM picture of cubic diamond crystals formed on a substrate in accordance with the present invention. The shapes of the crystalline diamond deposited depend on many factors such as oxygen pressure, spacing between the target and the substrate, substrate temperature, surface conditions and others. The crystals of FIG. 3 were subject to Raman spectroscopy for analysis. FIG. 6 shows a Renishaw Raman spectrum of crystals of FIG. 3. Diamond has a characteristic Raman signal at $1330\pm6$ cm$^{-1}$, while graphite has a smaller peak at 1350 cm$^{-1}$ and a major peak at 1597 cm$^{-1}$. In FIG. 6 therefore the signal at 1324 cm$^{-1}$ substantiates a diamond structure being present, while the signal at 1597 cm$^{-1}$ shows the presence of graphite. The presence of the graphite signal is at least in part due to the fact that the diameter of the analysing laser beam is greater than the size of the crystals at this stage. Micro-diffraction data obtained with a transmission electron microscope also supports the existence of a diamond structure.

It is believed that while the diamond is being deposited on the substrate, a thin layer of graphite is also formed that covers the whole silicon/diamond wafer. To remove this layer the whole wafer is imtermittently placed into an oxygen plasma asher for a few minutes. It is known that the etching rate of graphite in an oxygen plasma is greater than that of diamond, and hence by placing the wafer in such an asher the graphite layer can be removed.

Figure 4:
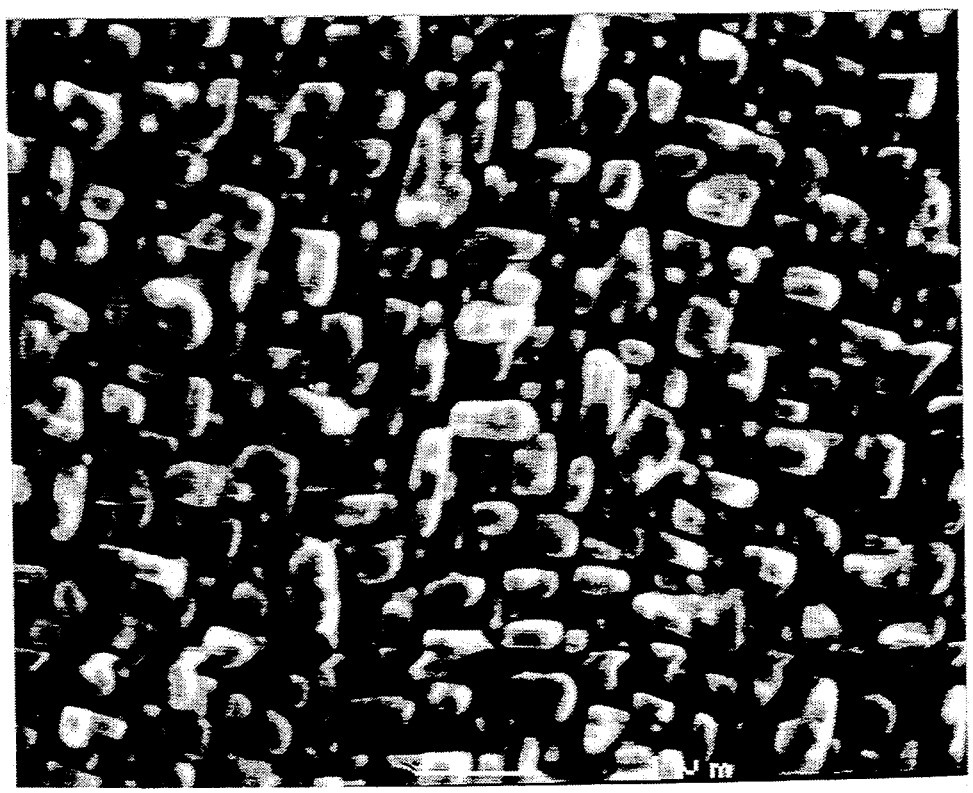
FIG. 4 is a SEM micrograph of diamond crystals deposited on a substrate to form a film thereon by polymer laser ablation in accordance with an embodiment of the present invention.
Figure 5:
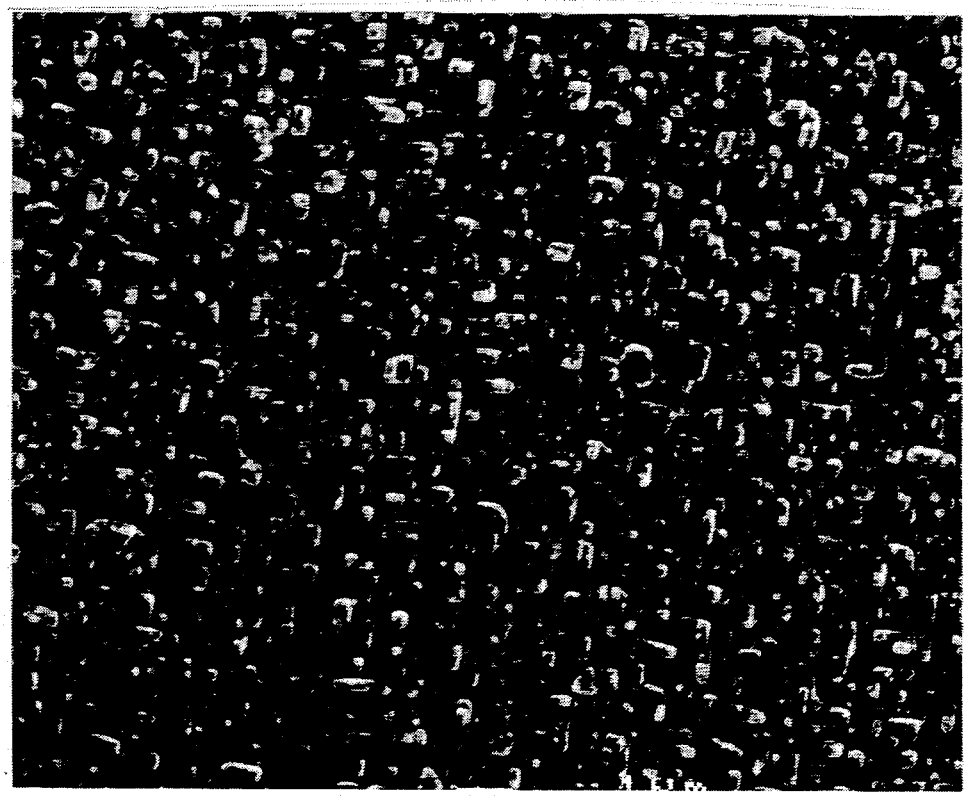
FIG. 5 is a SEM micrograph similar to that of FIG. 4.

After such intermittent ashing the deposition of diamond is continued until the diamond crystals cover the whole of the silicon substrate with a desired thickness as is shown in the SEM pictures forming FIGS. 4 and 5.

The invention has been described above with reference to the laser ablation of PMMA, it should be understood, however, that the invention is not limited thereto and other polymers, such as polystyrene, could be used, as also could graphite.

The diamond deposition process described herein is very simple in comparison with chemical vapour deposition (CVD) methods using plasma, torch or hot filament methods because no mixing of dangerous gases are required.

What we claim is:

1. A method for the deposition of diamond onto a substrate, comprising the steps of firing a laser at a polymer target in the presence of a reactive gas to effect laser ablation of said target, and providing a heated substrate.

2. A method as claimed in claim 1 wherein the polymer target consists of carbon, oxygen and hydrogen.

3. A method as claimed in claim 1 wherein the polymer target comprises carbon and hydrogen in the ratio of from 1:0 to 1:2.

4. A method as claimed in claim 1 wherein the reactive gas is oxygen.

5. A method as claimed in claim 1 wherein the reactive gas is hydrogen.

6. A method as claimed in claim 4 wherein the reactive gas is at a pressure of up to 5 Tort.

7. A method as claimed in claim 1 wherein the substrate is a silicon wafer heated to a temperature of from 400 to 700 degrees celsius.

8. A method as claimed in claim 1 wherein the laser is an ArF excimer laser.

9. A method as claimed in claim 1 wherein the laser is an Nd-Yag laser.

10. A method as claimed in claim 5 wherein the reactive gas is at a pressure of up to 5 Torr.

* * * * *

UNITED STATES PATENT AND TRADEMARK OFFICE
CERTIFICATE OF CORRECTION

PATENT NO. : 5,368,681
DATED : 11/29/94
INVENTOR(S) : Hiroyuki Hiraoka et al

It is certified that error appears in the above-identified patent and that said Letters Patent is hereby corrected as shown below:

ON THE TITLE PAGE
Delete the Assignee and insert --Hong Kong University of Science and Technology R and D Corporation Limited--.

Signed and Sealed this

Eleventh Day of April, 1995

Attest:

BRUCE LEHMAN

Attesting Officer  Commissioner of Patents and Trademarks